(12) United States Patent
Chiang (10) Patent No.: US 11,687,412 B2
(45) Date of Patent: *Jun. 27, 2023

(54) PROCESSING-IN-MEMORY INSTRUCTION SET WITH HOMOMORPHIC ERROR CORRECTION

(71) Applicant: TAIWAN SEMICONDUCTOR MANUFACTURING COMPANY, LTD., Hsinchu (TW)

(72) Inventor: Katherine H Chiang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/649,457

(22) Filed: Jan. 31, 2022

(65) Prior Publication Data

US 2022/0166445 A1 May 26, 2022

Related U.S. Application Data

(63) Continuation of application No. 17/143,717, filed on Jan. 7, 2021, now Pat. No. 11,237,907.

(Continued)

(51) Int. Cl.
*G06F 11/00* (2006.01)
*G06F 11/10* (2006.01)
(Continued)

(52) U.S. Cl.
CPC ..... *G06F 11/1076* (2013.01); *H03M 13/1105* (2013.01); *H03M 13/13* (2013.01); *H03M 13/611* (2013.01)

(58) Field of Classification Search
None
See application file for complete search history.

(56) References Cited

U.S. PATENT DOCUMENTS 5,689,727 A 11/1997 Bonke et al.
11,029,958 B1 6/2021 Zhang et al.
(Continued)

OTHER PUBLICATIONS

T. Barrett et al., "A double-data rate (DDR) processing-in-memory (PIM) device with wideword floating-point capability," 2006 IEEE International Symposium on Circuits and Systems (ISCAS), 2006, pp. 4 pp.-, doi: 10.1109/ISCAS.2006.1692989. (Year: 2006).*

(Continued)

*Primary Examiner* — Daniel F. McMahon
(74) *Attorney, Agent, or Firm* — Hauptman Ham, LLP (57) ABSTRACT

A method includes generating an ECC encoded output data by executing an ECC-Space operation using an ECC encoded first data from a memory as a first operand and an ECC encoded second data from the memory as a second operand. The ECC-Space operation is translated from a two operands operation that is operative to transform a first data and a second data into a third data. A result of encoding the first data is the ECC encoded first data and a result of encoding the second data is the ECC encoded second data if the first data and the second data are encoded with an ECC algorithm. The method also includes storing the ECC encoded output data to the memory. The ECC encoded output data is identical to a result of encoding the third data if the third data is encoded with the ECC algorithm.

20 Claims, 5 Drawing Sheets

Related U.S. Application Data (60) Provisional application No. 63/031,917, filed on May 29, 2020.

(51) Int. Cl.
  *H03M 13/11* (2006.01)
  *H03M 13/13* (2006.01)
  *H03M 13/00* (2006.01)

(56) References Cited

U.S. PATENT DOCUMENTS

| | | |
|---|---|---|
| 2010/0269016 A1 | 10/2010 | Ware |
| 2013/0139028 A1 | 5/2013 | Goel |
| 2015/0280748 A1 | 10/2015 | Gendler et al. |
| 2015/0363263 A1 | 12/2015 | Hassner et al. |
| 2016/0350617 A1* | 12/2016 | Willcock ............ G11C 11/4096 |
| 2017/0083237 A1 | 3/2017 | Potash |
| 2018/0060069 A1* | 3/2018 | Rosti ................... G06F 9/30185 |
| 2019/0102254 A1 | 4/2019 | Saxena |
| 2020/0097360 A1 | 3/2020 | Lu |
| 2020/0293319 A1* | 9/2020 | Lee ..................... G06F 9/30145 |
| 2020/0293452 A1* | 9/2020 | Lee ....................... G06F 9/3814 |

OTHER PUBLICATIONS

S. Dolev, S. Frenkel and D. E. Tamir, "Error correction based on hamming distance preserving in arithmetical and logical operations," 2012 IEEE 27th Convention of Electrical and Electronics Engineers in Israel, Eilat, Israel, 2012, pp. 1-5, doi: 10.1109/EEEI.2012.6376946. (Year: 2012).*

Yang X, Hou Y, He H. A Processing-in-Memory Architecture Programming for Wireless Internet-of-Things Applications. Sensors (Basel). 2019;19(1):140. Published Jan. 3, 2019. doi: 10.3390/s19010140 (Year: 2019).

* cited by examiner

PROCESSING-IN-MEMORY INSTRUCTION SET WITH HOMOMORPHIC ERROR CORRECTION

PRIORITY CLAIM AND CROSS-REFERENCE

The present application is a continuation of U.S. application Ser. No. 17/143,717, filed Jan. 7, 2021, which claims the priority of U.S. Provisional Application No. 63/031,917, filed May 29, 2020, which is incorporated herein by reference in its entirety.

BACKGROUND

An error correcting code (ECC) is an encoding scheme that transmits messages or stores data as binary numbers, in such a way that the message can be recovered even if some bits are erroneously flipped. ECC encoded data are often used in data transmission and data storage to defend against data corruption. After original data are transformed into ECC encoded data by ECC encoding processes based on an ECC algorithm of choice, the ECC encoded data are transmitted and/or stored. Based on the ECC algorithm of choice, the original data are recovered from the ECC encoded data with ECC decoding processes, even if the ECC encoded data have some data errors such as bit flips.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To enhance data robustness, many memory devices are implemented with embedded ECC functions, and data stored in the memory devices are ECC encoded data. Before the ECC encoded data are stored into a memory device, the original data are transformed into the ECC encoded data by ECC encoding processes. When the data stored in the memory device are ECC encoded data, a data processor for running a memory related operation often does not operate on the stored data directly for some of the operations (such as, ADD, XOR, or AND). In many embodiments, when the original data need to be processed by a processor (such as a central processing unit "CPU"), the ECC encoded data are converted back to the original data by ECC decoding processes before the original data are processed further. After the original data are processed by the data processor, output data are generated. In many embodiments, the output data are transformed into the ECC encoded output data by ECC encoding processes, and the ECC encoded output data are stored in the memory device.

When the data stored in the memory device are ECC encoded data, the ECC decoding/encoding processes performed in a CPU add significant operation overhead and reduce the speed performance. In some embodiments of the present disclosure, however, when the ECC encoded output data are generated by executing an ECC-Space operation using the ECC encoded data as operands and the memory device are implemented with a processing-in-memory ("PIM") PIM architecture, the speed performance of data manipulation on a memory device with the PIM architecture is improved. An ECC-Space operation refers to an operation that takes existing ECC encoded data as the input data and generates another ECC encoded data as the output data. In some embodiments, the ECC-Space operation is determined based on a truncated ECC-Space operation and the ECC algorithm for encoding. The truncated ECC-Space operation is an operation that takes existing ECC encoded data as the input date and generates the output data that needs to be further encoded to become another ECC encoded data.

In some embodiments, each original data before subjecting to the ECC encoding process data is represented by a vector in a Euclidian space with a first dimension, and each ECC encoded data is represented by a vector in a Euclidian space with a second dimension. The Euclidian space supporting the vectors of ECC encoded data is defined as an ECC-Space in the present disclosure. The vector of the output data generated from the ECC-Space operation has the second dimension, and the vector of the output data generated from the truncated ECC-Space operation has the first dimension which is smaller than the second dimension.

Figure 1:
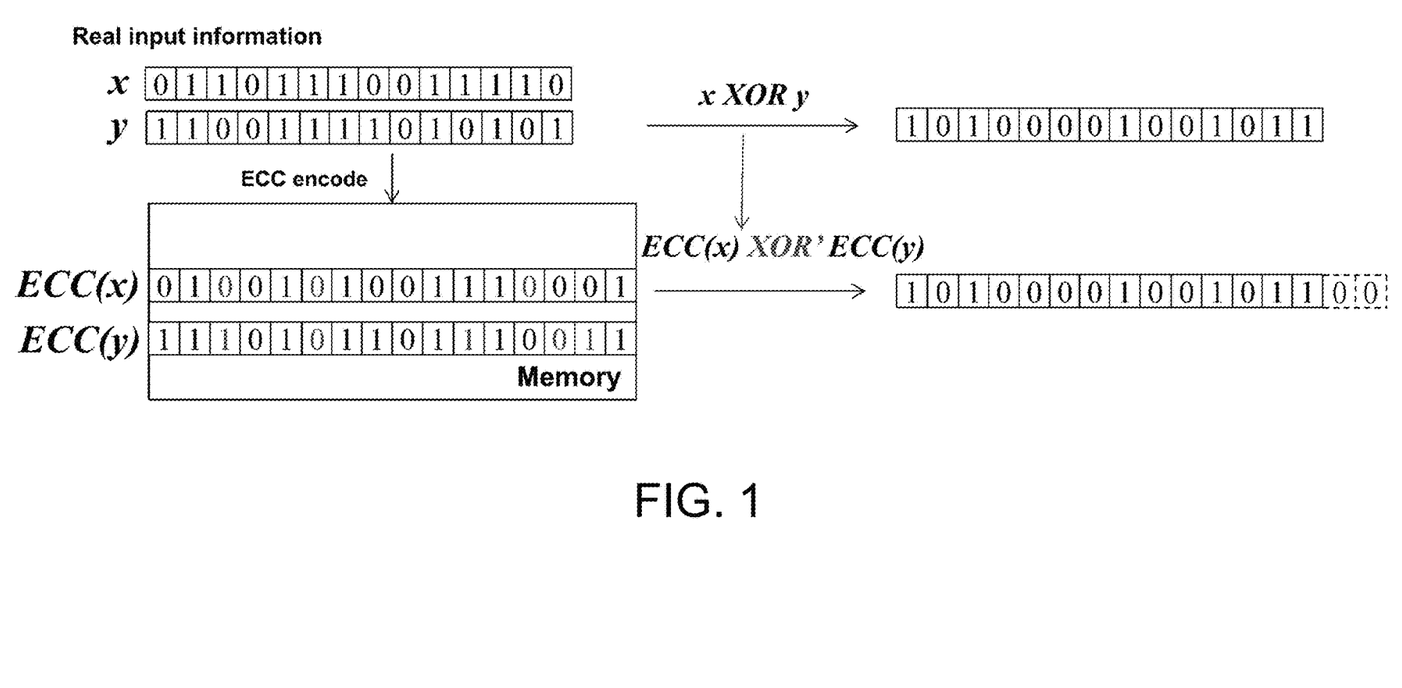
FIG. 1 and FIG. 2 are drawings of relationships between various operators and operands used in data manipulation of data in a memory device, in accordance with some embodiments.
Figure 2:
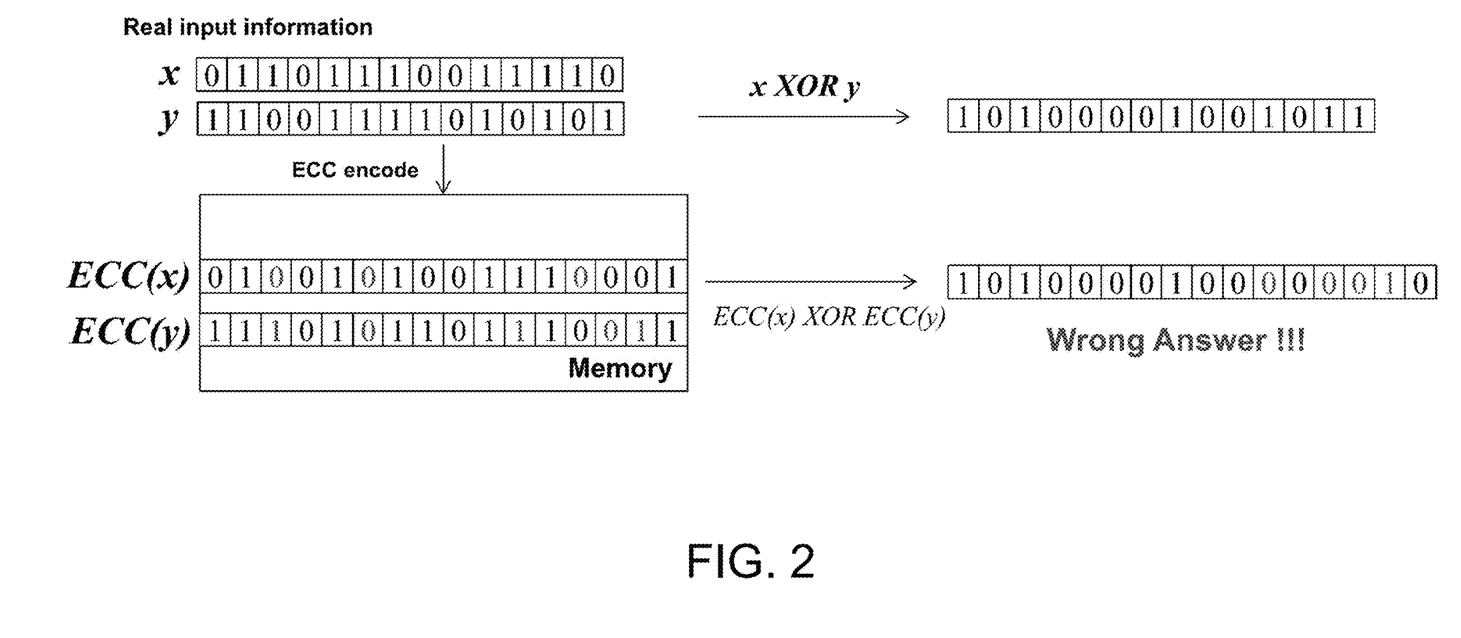

FIG. 1 and FIG. 2 are drawings of relationships between various operators and operands used in data manipulation of a memory device, in accordance with some embodiments. In FIG. 1, the bitwise operator XOR is used as an example, and the truncated ECC-Space operation XOR' corresponding to the bitwise operator XOR is presented in the figure. When the bitwise operator XOR is implemented as a two operand operation in an instruction set of a processor, a first data "x"=(0110 1110 0111 10) is transferred into a first register of the processor as a first operand, and a second data "y"=(1100 1111 0101 01) is transferred into a second register of the processor as a second operand. After the bitwise operator XOR is executed by the processor, a third data "z"=(1010 0001 0010 11) is generated by the processor. In some embodiments, the third data "z" are transformed into an ECC coded third data ECC(z) by ECC encoding processes, and the ECC coded third data ECC(z)=(1010 0001 0010 1100) are stored in the memory device.

When the first data "x" and the first data "y" are stored in the memory device correspondingly as ECC encoded first data ECC(x) and ECC encoded second data ECC(y), the truncated ECC-Space operation XOR' enables the third data, such as z=(1010 0001 0010 11), to be obtained directly from the ECC encoded first data ECC(x) and the ECC encoded second data ECC(y). That is, z=ECC(x) XOR' ECC(y). In contrast, when the data in the memory device are ECC encoded data, if the third data "z" needs to be obtained by executing the bitwise operator XOR in the processor as an operation in an instruction set architecture ("ISA") of a processor such as a CPU, the ECC encoded data ECC(x) and ECC(y) needs to be first converted back to the first data "x" and the first data "y" by ECC decoding processes, before the bitwise operator XOR is executed.

Without performing the ECC decoding processes, if the ECC encoded data ECC(x) and ECC(y) are used directly as the operands for the bitwise operator XOR, the output data generated by the processor would be an erroneous result. As shown in the example of FIG. 2, the obtained result of ECC(x) XOR ECC(y)=(1010 0001 0000 0010) is different from the correct result for the ECC encoded third data ECC(z)=(1010 0001 0010 1100). Additionally, in the obtained result of ECC(x) XOR ECC(y), if the last two bits (. . . . . . . . . . . . . 10) are interpreted as appended by the ECC algorithm to the original data (1010 0001 0000 00.) which is in a format before subjecting to ECC encoding processes, then, the supposedly original third data (1010 0001 0000 00) is different from the correct value of the third data "z"=(1010 0001 0010 11).

In FIG. 1, if the truncated ECC-Space operation XOR' for obtaining the third data can be determined based on the ECC algorithm used for encoding/decoding the data, then the corresponding ECC-Space operation $\overline{XOR}$ for obtaining the ECC encoded third data ECC(z) can also be determined. The ECC-Space operation $\overline{XOR}$ enables the ECC encoded third data, such as ECC(z)=(1010 0001 0010 1100), to be obtained directly from the ECC encoded first data ECC(x) and the ECC encoded second data ECC(y). That is, ECC(z) =ECC(x) $\overline{XOR}$ ECC(y). In the above, the truncated ECC-Space operation XOR' maps the operands ECC(x) and ECC(y) to the result z, which is XOR': ECC(x), ECC(y)→z. The operation ECC maps the result z to the ECC encoded third data ECC(z), which is ECC: z→ECC(z). The ECC-Space operation $\overline{XOR}$ maps the operands ECC(x) and ECC (y) to encoded third data ECC(z), which is $\overline{XOR}$ : ECC(x), ECC(y)→ECC(z). Consequently, the ECC-Space operation $\overline{XOR}$ is a composite function of the operation ECC and the truncated ECC-Space operation XOR', that is, $\overline{XOR}$ =ECC°XOR'.

In FIG. 1 and FIG. 2, the bitwise operator XOR is used as an example, and it is shown that the truncated ECC-Space operation XOR' and the ECC-Space operation $\overline{XOR}$ are correspondingly used to obtain the third data z and the ECC encoded third data ECC(z) directly from the ECC encoded data ECC(x) and ECC(y), where z=x XOR y. Generally, for certain two operands operation * selected from an instruction set of a processor, if the two operands operation * maps a first data x and a second data y to a third data such that z=x*y, in some embodiments, it is possible to realize a corresponding ECC-Space operation $\overline{*}$ for obtaining the ECC encoded third data ECC(z) from the ECC encoded first data ECC(x) and the ECC encoded second data ECC(y) such that ECC(z)=ECC(x)$\overline{*}$ECC(y). In some embodiments, for the two operands operation *, it is possible to realize a corresponding truncated ECC-Space operation *' for obtaining the third data z from the ECC encoded first data ECC(x) and the ECC encoded second data ECC(y) such that z=ECC (x)*'ECC(y). Then, based on the truncated ECC-Space operation *', the ECC-Space operation $\overline{*}$ is determined as a composite function of the operation ECC and the truncated ECC-Space operation *'. That is, the ECC-Space operation $\overline{*}$=ECC°*'.

In the above, the two operands operation * maps a first data x and a second data y to a third data z, which is *: x, y→z. The truncated ECC-Space operation *' maps the operands ECC(x) and ECC(y) to the result z, which is *': ECC(x), ECC(y)→z. The operation ECC maps the result z to the ECC encoded third data ECC(z), which is ECC: z→ECC(z). The ECC-Space operation $\overline{*}$ maps the operands ECC(x) and ECC(y) to encoded third data ECC(z), which is operation $\overline{*}$: ECC(x), ECC(y)→ECC(z).

Figure 3:
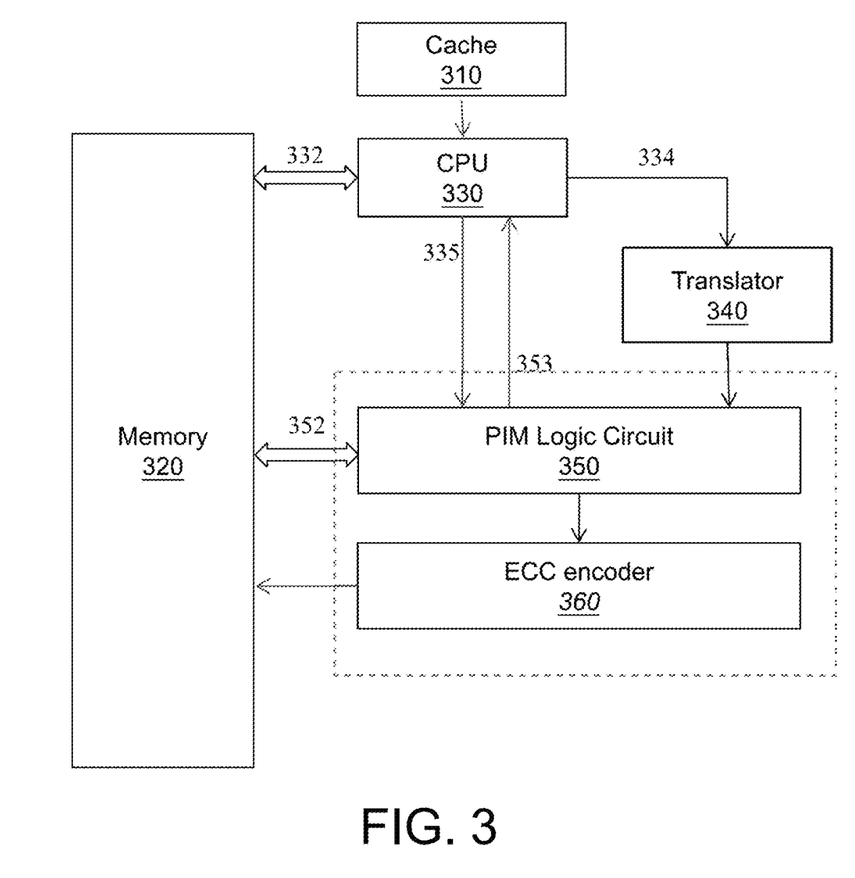
FIG. 3 is a schematic drawing of a data processing system having a memory implemented with PIM capabilities, in accordance with some embodiments.

FIG. 3 is a schematic drawing of a data processing system 300 having a memory implemented with PIM capabilities, in accordance with some embodiments. The data processing system 300 includes a memory 320, a processor 330 (such as a Central Processing Unit), a cache memory 310, a translator 340, a PIM enabling logic circuit 350, and an ECC encoder 360. While the PIM enabling logic circuit 350 often has registers to support PIM related operations, the PIM enabling logic circuit 350 sometimes include dedicated local memories (such as cache memories) for data storage or microcode storage. The data bus 332 is implemented for data transmission between the memory 320 and the processor 330, and the data bus 352 is implemented for data transmission between the memory 320 and the PIM enabling logic circuit 350. In operation, after an instruction is fetched from the cache memory 310 and received by the processor 330, the category of the instruction received is determined by the processor 330. Some of the instructions received by the processor 330 belong to the instruction set of the processor 330. Some of the instructions received by the processor 330 are instructions intended for the PIM enabling logic circuit 350. The digital signal connections 335 and 353 are implemented for data exchanges between the processor 330 and the PIM enabling logic circuit 350. The digital signal connection 334 is implemented to transmit data from the processor 330 to the translator 340.

In some embodiments, the PIM enabling logic circuit 350 and the ECC encoder 360 are implemented as a part of the memory 320. In some embodiments, along with the PIM enabling logic circuit 350 and an ECC encoder 360, the translator 340 is also implemented as a part of the memory 320. Adding the PIM enabling logic circuit 350 and the ECC encoder 360 to the memory 320 enables the memory 320 to perform various supported operations on ECC encoded data in the memory 320 directly, with reduced operation working load on the processor 330 (such as a Central Processing Unit).

In some embodiments, the memory 320, which includes the PIM enabling logic circuit 350 and the ECC encoder 360 as internal circuits, are implemented on a single memory chip. In some embodiments, the memory 320, which includes the PIM enabling logic circuit 350 and the ECC encoder 360 as internal circuits, are provided to IC designers and/or manufacturers as one or more Intellectual Property files (such as layout files in GDSII format or circuit files in Verilog/VHDL format).

Figure 4:
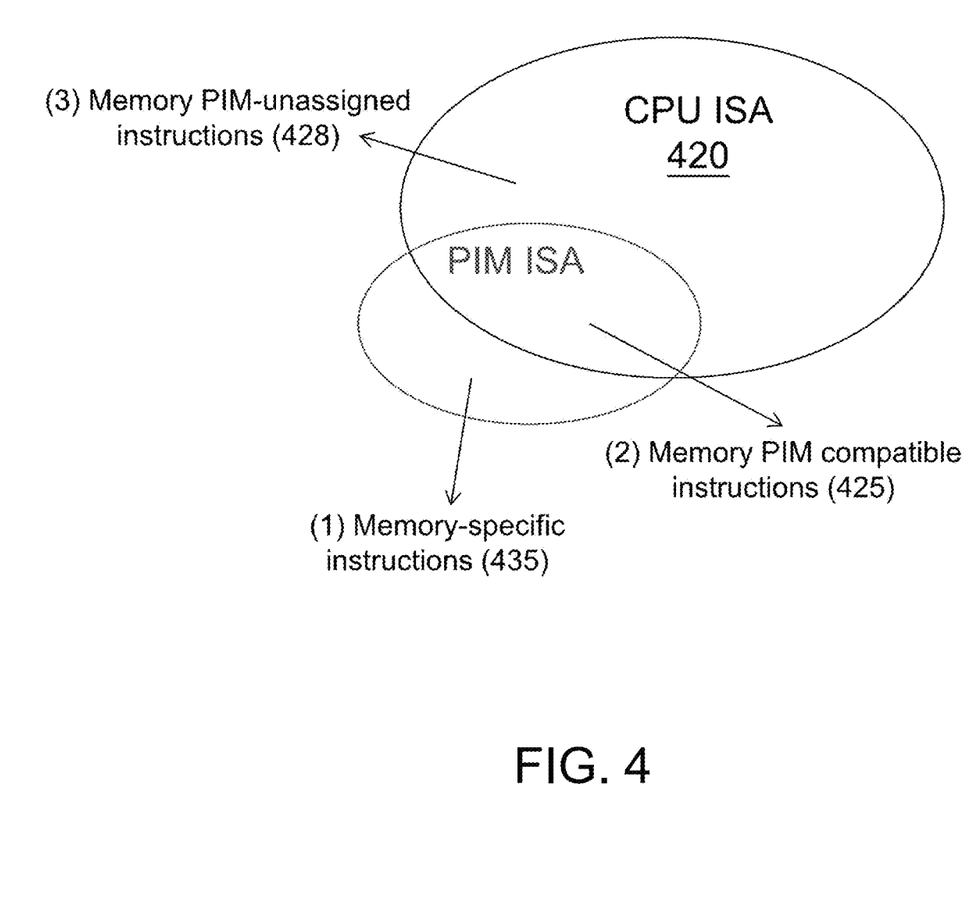
FIG. 4 is a classification diagram of the instructions received by the processor, in accordance with some embodiments.

FIG. 4 is a classification diagram of the instructions received by the processor 330, in accordance with some embodiments. In FIG. 4, the instructions received by the processor 330 are classified into three categories. The first category 435 encompasses memory-specific instructions intended specifically for being executed in the PIM enabling logic circuit 350. The second category 425 encompasses memory PIM compatible instructions in a first portion of the instruction set 420 of the processor 330, intended for being translated into PIM instructions for the PIM enabling logic circuit 350. The third category 428 encompasses memory PIM compatible instructions in a second portion of the instruction set 420 of the processor 330, intended for being executed in the processor 330 as native instructions.

In FIG. 4, each instruction in the first category 435 and the second category 425 has a corresponding PIM instruction of the PIM ISA for the PIM enabling logic circuit 350. Each instruction in the instruction set 420 of the CPU ISA for the processor 330 belongs either to the second category 425 or to the third category 428. For a selected instruction in the instruction set 420, if a corresponding PIM instruction for the selected instruction is implemented for the PIM enabling logic circuit 350, then, the selected instruction belongs to the second category 425. For example, when the ECC-Space operation $\overline{XOR}$ or the truncated ECC-Space operation XOR' is implemented for the PIM enabling logic circuit 350, the bitwise operator XOR for the processor 330 is classified as belonging to the second category 425.

Figure 5:
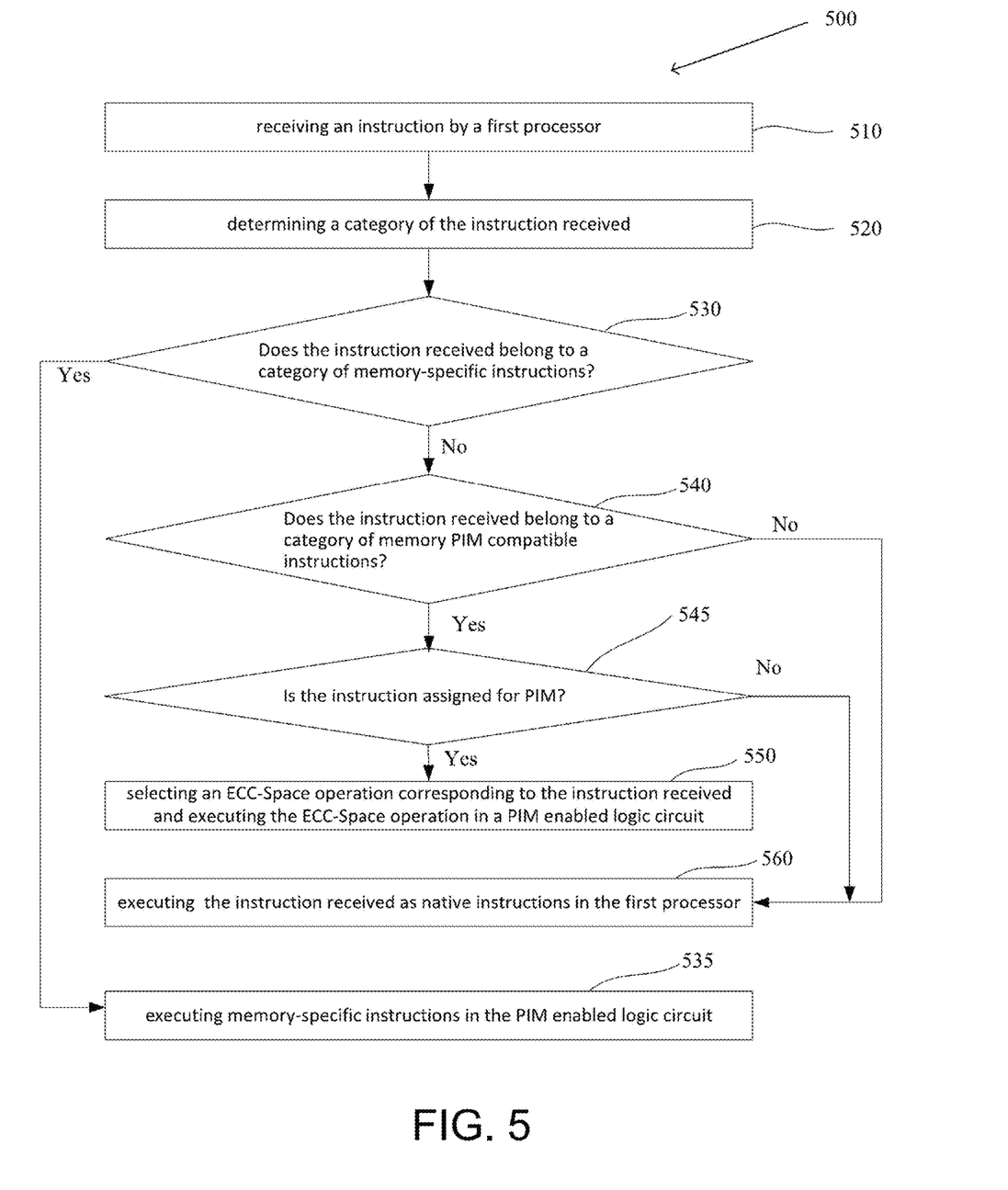
FIG. 5 is a flow chart of a method of data manipulation for a memory device, in accordance with some embodiments.

FIG. 5 is a flow chart of a method 500 of data manipulation for a memory device, in accordance with some embodiments. In operation 510 of the method 500, an instruction is received by a first processor, e.g., processor 330 (FIG. 3). In some embodiments, as shown in FIG. 3, the instructions received by the processor 330 are fetched from the cache memory 310. In operation 520 of the method 500, the category of the instruction received is determined by the first processor. In some embodiments, as shown in FIG. 4, each of the instructions received by the processor 330 belongs to one of the three categories: the first category 435 of the memory-specific instructions, the second category 425 of the memory PIM compatible instructions, or the third category 428 of PIM-unassigned native instructions of the processor 330.

Following operation 520, at operation 530, if the instruction received belongs to the category of memory-specific instructions (such as the first category 435 in FIG. 4), the process flow proceeds to operation 535, but if the instruction does not belong to the category of memory-specific instructions, the process flow proceeds to operation 540.

In operation 535, which is in the "YES" branch from operation 530 in FIG. 5, one or more memory-specific instructions are executed in the PIM enabling logic circuit, e.g., PIM logic circuit 350 (FIG. 3). For example, in the embodiments of FIG. 3, the instructions received by the processor 330 are forwarded to the PIM enabling logic circuit 350 though the digital signal connection 335, and one or more memory-specific instructions are executed in the PIM enabling logic circuit 350. During the execution of the one or more memory-specific instructions, the data bus 352 enables data to be fetched from the memory 320 to the PIM enabling logic circuit 350 and enables data to be sent to the memory 320 from the PIM enabling logic circuit 350.

In operation 540, which is in the "NO" branch from the operation 530 in FIG. 5, if the instruction received belongs to a category of memory PIM compatible instructions (such as the second category 425 in FIG. 4), the process flow proceeds to operation 545, but if the instruction received does not belong to a category of memory PIM compatible instructions, the process flow proceeds to operation 560.

In operation 560, which is in the "NO" branch from the operation 540 in FIG. 5, the instruction received is executed in the first processor as a native instruction of the first processor. In the embodiment of FIG. 3, the instruction received is executed in the processor 330. Because the instruction received does not belong to a category of memory PIM compatible instructions as determined at operation 540, the instruction received is an instruction in the instruction set 420 of the CPU ISA as shown in FIG. 4. An instruction in the instruction set 420 of the CPU ISA for the processor 330 belongs either to the second category 425 or to the third category 428. As determined at operation 540, the instruction received does not belong to the second category 425 of memory PIM compatible instructions. Consequently, the instruction received belongs to the third category 428, which is a category of memory PIM-unassigned native instructions of the processor 330. In operation 560, during the execution of the instruction received in the processor 330 as a native instruction, the data bus 332 enables data to be fetched from the memory 320 to the processor 330 and enables data to be sent to the memory 320 from the processor 330.

In operation 545, which is in the "YES" branch from the operation 540 in FIG. 5, if the instruction received is assigned to the PIM enabling logic circuit for further processing, the process flow proceeds to operation 550, but if the instruction received is not assigned to the PIM enabling logic circuit for further processing, the process flow proceeds to operation 560. In some embodiments, the determination of whether an instruction needs to be assigned to the PIM enabling logic circuit is static, and the assignment does not depend upon the working load of the first processor. In some embodiments, the determination of whether an instruction needs to be assigned to the PIM enabling logic circuit is dynamic, and the assignment depends upon the working load balance between the first processor and the PIM enabling logic circuit.

In operation 550, which is in the "YES" branch from the operation 540 and the "NO" branch from the operation 545 in FIG. 5, an ECC-Space operation corresponding to the instruction received is selected and the ECC-Space operation executed in a PIM enabling logic circuit. In the embodiments of FIG. 3, when the instruction received is a memory PIM compatible instruction in the second category 425, the instruction received is sent to the translator 340 through the digital signal connection 334. An ECC-Space operation corresponding to the instruction received is selected by the translator 340 based on the instruction received from the processor 330. The ECC-Space operation selected is executed in the PIM enabling logic circuit 350. During the execution of the ECC-Space operation, the data bus 352 enables data to be fetched from the memory 320 to the PIM enabling logic circuit 350 and enables data to be sent to the memory 320 from the PIM enabling logic circuit 350. In some embodiments, when the instruction received is recognized as a memory PIM compatible instruction in the second category 425, an ECC-Space operation corresponding to the instruction received is selected by the translator 340 based on a lookup table, and the ECC-Space operation is transmitted to the PIM enabling logic circuit 350. In some embodiments, based on a lookup table, an ECC-Space operation selected is represented by a proxy in the form of a truncated ECC-Space operation, and the truncated ECC-Space operation corresponding to the instruction received is transmitted to the PIM enabling logic circuit 350.

As described above, the operations 535, 550, and 560 are category dependent operations, because the category of the instruction received determines which one of the operations 535, 550, and 560 is carried out (also referred to as being executed). If the category of the instruction received is the category of memory-specific instructions (such as the first category 435 in FIG. 4), the operation 535 is executed accordingly. If the category of the instruction received is the category of memory PIM compatible instructions (such as the second category 425 in FIG. 4), the operation 550 is executed accordingly. If the category of the instruction received is the category of PIM-unassigned native instructions (such as the third category 428 in FIG. 4), the operation 560 is executed accordingly.

In some embodiments, the instruction received corresponds to a two operands operation * for the processor 330, and the two operands operation is operative to transform a first data and a second data into a third data. In some embodiments, the two operands operation * is represented by an opcode for the processor 330. In some embodiments, the ECC-Space operation * corresponding to the two operands operation * is represented by an opcode for the PIM enabling logic circuit 350. The ECC-Space operation * is operative to transform an ECC encoded first data and an ECC encoded second data into a third data. In some embodiments, the truncated ECC-Space operation *' corresponding to the two operands operation * is represented by an opcode for the PIM enabling logic circuit 350. The truncated ECC-Space operation *' is operative to transform an ECC encoded first data and an ECC encoded second data into an ECC encoded third data.

In some embodiments, during operation 550, after the instruction received by the processor 330 is a two operands operation * and after the two operands operation * is recognized by the processor 330 as a memory PIM compatible instruction in the second category 425, the opcode representing the two operands operation * is transmitted to the translator 340 from the processor 330 through the digital signal connection 334.

In some embodiments, after the opcode representing the two operands operation * is received by the translator 340, based on a lookup table in the translator 340, the opcode representing the ECC-Space operation * corresponding to the two operands operation * is transmitted to the PIM enabling logic circuit 350 from the translator 340. Then, the ECC-Space operation * is executed in the PIM enabling logic circuit 350. During the execution of the ECC-Space operation *, the ECC encoded first data ECC(x) and the ECC encoded second data ECC(y) are fetched from the memory 320 to the PIM enabling logic circuit 350 through the data bus 352. After the execution of the ECC-Space operation *, the ECC encoded third data ECC(z)=ECC(x)*ECC(y) is generated by the PIM enabling logic circuit 350 and transmitted to the memory 320 through the data bus 352.

In some embodiments, after the opcode representing the two operands operation * is received by the translator 340, based on a lookup table in the translator 340, the opcode representing the truncated ECC-Space operation *' corresponding to the two operands operation * is transmitted to the PIM enabling logic circuit 350 from the translator 340. Then, the truncated ECC-Space operation *' is executed in the PIM enabling logic circuit 350. During the execution of the truncated ECC-Space operation *', the ECC encoded first data ECC(x) and the ECC encoded second data ECC(y) are fetched from the memory 320 to the PIM enabling logic circuit 350 through the data bus 352. After the execution of the truncated ECC-Space operation *', the third data z=ECC(x)*'ECC(y) is generated by the PIM enabling logic circuit 350 and transmitted to the ECC encoder 360. Then, the ECC encoded third data ECC(z) is generated from the third data z by the ECC encoder 360 based on the ECC encoding processes implemented for the memory device. At the end of the operation 550, the ECC encoded third data ECC(z) is transmitted to the memory 320. The execution of the truncated ECC-Space operation *' in the PIM enabling logic circuit 350 and the ECC encoding of the third data z by the ECC encoder 360 is equivalent to the execution of the ECC-Space operation *=ECC∘*'.

In some embodiments, the ECC-Space operation * or the truncated ECC-Space operation *' is implemented as logic circuits in the PIM enabling logic circuit 350. The logic circuits for implementing the ECC-Space operation * or the truncated ECC-Space operation *' are determined based on the two operands operation * and the ECC algorithm for encoding the data in the memory 320. In some embodiments, the PIM enabling logic circuit 350 includes a PIM enabling processor, in which the ECC-Space operation * or the truncated ECC-Space operation *' is implemented as microprograms comprising instructions from the instruction set of the PIM enabling processor. The microprograms for implementing the ECC-Space operation * or the truncated ECC-Space operation *' are determined based on the two operands operation * and the ECC algorithm for encoding the data in the memory 320.

In some embodiments, the PIM enabling logic circuit 350 and the ECC encoder 360 are combined with the memory 320 to form a stand-alone memory system. In some embodiments, the stand-alone memory system provides the flexibility of combining with various kinds of CPU 330, various kinds of translator 340, and various kinds of cache memory 310, for performing data manipulations on ECC encoded data in the memory. In some embodiments, one or both of the PIM enabling logic circuit 350 and the ECC encoder 360 are part of the memory 320.

In some embodiments, the ECC-Space operation * is determined based on the mathematic relationship *=ECC∘*', in which the ECC-Space operation is a composite function of the operation ECC and the truncated ECC-Space operation *'. Consequently, in some embodiments, the logic circuits or the microprograms for implementing the ECC-Space operation * depend upon the logic circuits or the microprograms for implementing the truncated ECC-Space operation *'. In some embodiments, the implementations of the truncated ECC-Space operation *' are determined based on the mathematic relationships connecting the truncated ECC-Space operation *' to the two operands operation * and the ECC algorithm for encoding the data in the memory 320.

Provided as non-limiting examples, when the Hamming ECC algorithm is selected as the ECC algorithm for encoding the data in the memory 320, the mathematic relationships connecting the truncated ECC-Space operation *' to the two operands operation * and the Hamming ECC algorithm are explained in the following.

In some embodiments, each of the first data x, the second data y, and the third data z is represented by a corresponding vector $\vec{x}$, $\vec{y}$, and $\vec{z}$ in an n-dimensional linear space, such that $\vec{x}=[x_1, x_2, x_3, \ldots x_n]^T$, $\vec{y}=[y_1, y_2, y_3, \ldots y_n]^T$, and $\vec{z}=[z_1, z_2, z_3, \ldots z_n]^T$. The two operands operation * for the processor 330 is a linear transformation from the Euclidian space $R^n \times R^n$ to the Euclidean space $R^n$, as expressed by the equation $\vec{x}*\vec{y}=\vec{z}$. In some embodiments, each of the ECC encoded first data ECC(x), the ECC encoded second data ECC(y), and the ECC encoded third data ECC(z) is represented by a corresponding vector ECC(x), ECC(y), and ECC(i) in an m-dimensional linear space, such that ECC($\vec{x}$)=$[x'_1, x'_2, x'_3, \ldots x'_m]^T$, ECC($\vec{y}$)=$[y'_1, y'_2, y'_3, \ldots y'_m]^T$, and ECC($\vec{z}$)=$[z'_1, z'_2, z'_3, \ldots z'_m]^T$. Because each of the vectors ECC($\vec{x}$), ECC($\vec{y}$), and ECC($\vec{z}$) is in the Euclidian space $R^m$ and also represents an ECC coded data, the Euclidian space $R^m$ in the present disclosure is defined as an ECC-Space. The truncated ECC-Space operation *' for the PIM enabling logic circuit 350 is a linear transformation from the Euclidian space $R^m \times R^m$ to the Euclidean space $R^n$, as expressed by the equation ECC($\vec{x}$)*'ECC($\vec{y}$)=$\vec{z}$. The ECC-Space operation * for the PIM enabling logic circuit 350 is a linear transformation from the Euclidian space $R^m \times R^m$ to the Euclidean space $R^m$, as expressed by the equation ECC($\vec{x}$)*ECC($\vec{y}$)=ECC($\vec{z}$).

As a non-limiting example, when the ECC encoded data in the memory 320 is the (7, 4) Hamming code, each of the ECC encoded data has n=4 bits of real data, and a total of m=7 bits are needed for error correction. With the (7, 4) Hamming code, the first data x, the second data y, and the third data z are correspondingly represented by column vectors $\vec{x}$, $\vec{y}$, and $\vec{z}$, which are expressed as the mathematical relationships in the following:

$$\vec{x}=[x_1,x_2,x_3,x_4]^T,$$

$$\vec{y}=[y_1,y_2,y_3,y_4]^T,$$

$$\vec{z}=[z_1,z_2,z_3,z_4]^T.$$

Furthermore, the ECC encoded first data ECC(x), the ECC encoded second data ECC(y), and the ECC encoded third data ECC(z) are correspondingly represented by the column vectors ECC($\vec{x}$), ECC($\vec{y}$), and ECC($\vec{z}$), which are expressed as the mathematical relationships in the following:

$$ECC(\vec{x})=[x'_1,x'_2,x'_3,x'_4,x'_5,x'_6,x'_7]^T,$$

$$ECC(\vec{y})=[y'_1,y'_2,y'_3,y'_4,y'_5,y'_6,y'_7]^T,$$

$$ECC(\vec{z})=[z'_1,z'_2,z'_3,z'_4,z'_5,z'_6,z'_7]^T.$$

In some embodiments, the generator matrix $\overleftrightarrow{G}$ for the (7, 4) Hamming code is, $$\overleftrightarrow{G} = \begin{pmatrix} 1 & 0 & 0 & 0 & 1 & 1 & 1 \\ 0 & 1 & 0 & 0 & 1 & 1 & 0 \\ 0 & 0 & 1 & 0 & 1 & 0 & 1 \\ 0 & 0 & 0 & 1 & 0 & 1 & 1 \end{pmatrix}^T$$

When the generator matrix $\overleftrightarrow{G}$ is operated on the column vector $\vec{z}$, based on the equation for the ECC encoded third data ECC($\vec{z}$)=$\overleftrightarrow{G}\vec{z}$, the following equation is obtained:

$$ECC(\vec{z})=[z_1,z_2,z_3,z_4,z_1+z_2+z_3,z_1+z_2+z_4,z_1+z_3+z_4]^T$$

With the (7, 4) Hamming code, when the ECC encoded third data ECC(z) has no bit-flip errors, $z'_1=z_1$, $z'_2=z_2$, $z'_3=z_3$, $z'_4=z_4$; furthermore, $z'_5=z_1+z_2+z_3$, $z'_6=z_1+z_2+z_4$, and $z'_7=z_1+z_3+z_4$. Because ECC($\vec{z}$)=$\overleftrightarrow{G}\vec{z}$, if the vector $\vec{z}$ can be obtained from the vectors ECC($\vec{x}$) and ECC($\vec{y}$) based on the truncated ECC-Space operation *' such that $$\vec{z}=ECC(\vec{x})*'ECC(\vec{y}),$$

then the vector ECC($\vec{z}$) can also be obtained from the vectors ECC($\vec{x}$) and ECC($\vec{y}$). That is, if the truncated ECC-Space operation *' can be determined based on the two operands operation * for the first processor using the (7, 4) Hamming coding algorithm, then the ECC-Space operation * can also be determined such that $$ECC(\vec{z})=ECC(\vec{x})*ECC(\vec{y}).$$

In some embodiments, when the two operands operation * is a bitwise operator, the vector $\vec{z}$ is obtained from the vectors ECC($\vec{x}$) and ECC($\vec{y}$) based on the following equations:

$$z_1 = \begin{cases} [(x'_1+x'_2+x'_3+x'_5)\cdot(x'_1+x'_2+x'_4+x'_6)\cdot(x'_1+x'_3+x'_4+x'_7)\oplus x'_1]* \\ [(y'_1+y'_2+y'_3+y'_5)\cdot(y'_1+y'_2+y'_4+y'_6)\cdot(y'_1+y'_3+y'_4+y'_7)\oplus y'_1] \end{cases}$$

$$z_2 = \begin{cases} [(x'_1+x'_2+x'_3+x'_5)\cdot(x'_1+x'_2+x'_4+x'_6)\cdot\neg(x'_1+x'_3+x'_4+x'_7)\oplus x'_1]* \\ [(y'_1+y'_2+y'_3+y'_5)\cdot(y'_1+y'_2+y'_4+y'_6)\cdot\neg(y'_1+y'_3+y'_4+y'_7)\oplus y'_1] \end{cases}$$

$$z_3 = \begin{cases} [(x'_1+x'_2+x'_3+x'_5)\cdot\neg(x'_1+x'_2+x'_4+x'_6)\cdot(x'_1+x'_3+x'_4+x'_7)\oplus x'_1]* \\ [(y'_1+y'_2+y'_3+y'_5)\cdot\neg(y'_1+y'_2+y'_4+y'_6)\cdot(y'_1+y'_3+y'_4+y'_7)\oplus y'_1] \end{cases}$$

$$z_4 = \begin{cases} [\neg(x'_1+x'_2+x'_3+x'_5)\cdot(x'_1+x'_2+x'_4+x'_6)\cdot(x'_1+x'_3+x'_4+x'_7)\oplus x'_1]* \\ [\neg(y'_1+y'_2+y'_3+y'_5)\cdot(y'_1+y'_2+y'_4+y'_6)\cdot(y'_1+y'_3+y'_4+y'_7)\oplus y'_1] \end{cases}$$

In the above equations, a non-limiting example of the bitwise operator * is one of the bitwise logic operations, such as, the bitwise AND, the bitwise OR, the bitwise NOR, the bitwise XOR, or the bitwise NAND. In addition, the notations ECC($\vec{x'}$)=$[x'_1, x'_2, x'_3, \ldots x'_m]^T$ and ECC($\vec{y'}$), $[y'_1, y'_2, y'_3, \ldots y'_m]^T$ indicate that the ECC encoded first data ECC(x) and the ECC encoded second data ECC(y) as used in the above equation may contain bit-flip errors. In contrast, the notations ECC($\vec{x}$)=$[x_1, x_2, x_3, \ldots x_m]^T$ and ECC($\vec{y}$)=$[y_1, y_2, y_3, \ldots y_m]^T$ are used to represent correspondingly the ECC encoded first data ECC(x) and the ECC encoded second data ECC(y) without bit-flip errors.

When the equations for expressing the components $z_1$, $z_2$, $z_3$, and $z_4$ in terms of ECC($\vec{x}$) and ECC($\vec{y}$) are combined with the relationship $$\vec{z}=[z_1,z_2,z_3,z_4]^T=\text{ECC}(\vec{x})*'\text{ECC}(\vec{y}),$$

the truncated ECC-Space operation *' is obtained. In some embodiments, the operation *' obtained based on the above equations for expressing the components $z_1$, $z_2$, $z_3$, and $z_4$ is implemented as logic circuits in the PIM enabling logic circuit 350. In some embodiments, the operation *' obtained based on the above equations is implemented as microprograms in the PIM enabling logic circuit 350.

Furthermore, when the equations for expressing $z_1$, $z_2$, $z_3$, and $z_4$ in terms of $\text{ECC}(\vec{x})$ and $\text{ECC}(\vec{y})$ are combined with the relationship $$ECC(\vec{z}) = [z_1, z_2, z_3, z_4, z_1+z_2+z_3, z_1+z_2+z_4, z_1+z_3+z_4]^T$$
$$= ECC(\vec{x}) * ECC(\vec{y}),$$

the ECC-Space operation * is obtained. In some embodiments, after the operation * is determined based on the equations for expressing $z_1$, $z_2$, $z_3$, and $z_4$ in terms of $\text{ECC}(\vec{x})$ and $\text{ECC}(\vec{y})$, the ECC-Space operation * is then implemented as logic circuits in the PIM enabling logic circuit 350. In some alternative embodiments, after the ECC-Space operation * is determined based on the equations for expressing $z_1$, $z_2$, $z_3$, and $z_4$ in terms of $\text{ECC}(\vec{x})$ and $\text{ECC}(\vec{y})$, the ECC-Space operation * is then implemented as microprograms in the PIM enabling logic circuit 350.

After the ECC-Space operation * is executed in the PIM enabling logic circuit 350 using the ECC encoded first data ECC(x) as a first operand and the ECC coded second data ECC(y) as a second operand, the PIM enabling logic circuit 350 generates an ECC encoded output data. The ECC encoded output data is identical to a result of coding the third data z with the ECC algorithm, if the third data z is generated by executing the native operation * in the processor 330 using the first data x as a first operand and the second data y as a second operand.

In the above, the procedures for determining and implementing the truncated ECC-Space operation *' and the ECC-Space operation * are described using the (7, 4) Hamming code as an example. The procedures for determining and implementing the truncated ECC-Space operation *' and the ECC-Space operation * as described above are also applicable to other ECC codes and ECC algorithms. The applications of the above described procedures to other ECC codes and ECC algorithms are within the contemplated scope of the instant disclosure. For example, in some embodiments, the ECC algorithm used for determining and implementing the operation *' or the operation * is based on the Binary Golay codes, the Bose-Chaudhuri-Hocquenghem (BCH) codes, or the Low-density parity-check (LDPC) codes.

In some embodiments, the truncated ECC-Space operation *' or the ECC-Space operation * is implemented based on above described procedures for a set of bitwise operators which are functionally complete. Base on the functionally complete set of bitwise operators, other ECC-Space operations, such as word-wise logic operations or word-wise arithmetic operations, are implemented to support more complicated operations. For example, in some embodiments, after each of the basic ECC-Space bit-wise logic operations AND, OR, NOR, XOR, and NAND is implemented for the PIM enabling logic circuit 350, word-wise arithmetic operations, such as ADD or MULTIPLY are implemented in the PIM enabling logic circuit 350 as logic circuits or implemented as microprograms in a processor in the PIM enabling logic circuit 350 that supports the basic ECC-Space bit-wise logic operations.

An aspect of the present disclosure relates to a method. The method includes generating an ECC encoded output data by executing an ECC-Space operation using an ECC encoded first data from a memory as a first operand and an ECC encoded second data from the memory as a second operand. The ECC-Space operation is translated from a two operands operation of a first processor and the two operands operation is operative to transform the first data and the second data into a third data. The method includes storing the ECC encoded output data to the memory. The ECC encoded output data is identical to a result of encoding the third data with the ECC algorithm if the third data is encoded with the ECC.

Another aspect of the present disclosure relates to method of processing data in a memory device that supports processing-in-memory (PIM) operations. The method includes determining a category of an instruction received by a first processor, and processing one or more category-dependent operations based on the category determined. The processing one or more category-dependent operations includes selecting an ECC-Space operation corresponding to the instruction received and executing the ECC-Space operation in a logic circuit in the memory device when the category of the instruction received is a category of memory PIM compatible instructions.

Still another aspect of the present disclosure relates to a device. The device includes a memory operative to store an ECC encoded first data and an ECC encoded second data, and a logic circuit in the memory configured to execute an ECC-Space operation translated from a two operands operation that is operative to transform a first data and a second data into a third data operative to generate an ECC encoded output data from the ECC encoded first data and the ECC encoded second data. The ECC encoded first data is encoded from the first data with an ECC algorithm and the ECC encoded second data is encoded from the second data with the ECC algorithm. The ECC encoded output data is identical to a result of encoding the third data with the ECC algorithm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
generating an ECC encoded output data by executing an ECC-Space operation using an ECC encoded first data from a memory as a first operand and an ECC encoded second data from the memory as a second operand, wherein the ECC-Space operation is translated from a two operands operation of a first processor and wherein the two operands operation is operative to transform a first data and a second data into a third data, and wherein a result of encoding the first data is the ECC encoded first data and a result of encoding the second data is the ECC encoded second data if the first data and the second data are encoded with an ECC algorithm;

storing the ECC encoded output data to the memory; and wherein the ECC encoded output data is identical to a result of encoding the third data with the ECC algorithm if the third data is encoded with the ECC algorithm.

2. The method of claim 1, further comprising:
determining the ECC-Space operation based on a truncated ECC-Space operation and the ECC algorithm.

3. The method of claim 1, further comprising:
determining a truncated ECC-Space operation based on a transformation from a first vector and a second vector to a third vector using the two operands operation and the ECC algorithm, wherein the first vector represents the ECC encoded first data, the second vector represents the ECC encoded second data, and the third vector represents the third data.

4. The method of claim 1, wherein the two operands operation is a bitwise operator performing one of logic operations AND, OR, NOR, XOR, or NAND.

5. The method of claim 1, wherein the ECC algorithm is an algorithm based on Hamming codes, Binary Golay codes, Bose-Chaudhuri-Hocquenghem (BCH) codes, or Low-density parity-check (LDPC) codes.

6. A method of processing data in a memory device that supports processing-in-memory (PIM) operations, the method comprising:
determining a category of an instruction received by a first processor; and
processing one or more category-dependent operations based on the category determined, wherein the processing one or more category-dependent operations comprise:
selecting an ECC-Space operation corresponding to the instruction received and executing the ECC-Space operation in a logic circuit in the memory device when the category of the instruction received is a category of memory PIM compatible instructions.

7. The method of claim 6, further comprising:
executing the instruction in the first processor when the category of the instruction received is a category of PIM-unassigned native instructions of the first processor.

8. The method of claim 6, wherein the processing one or more category-dependent operations further comprises:
executing one or more memory-specific instructions in the logic circuit when the category of the instruction is a category of memory-specific instructions.

9. The method of claim 6, wherein the instruction received includes a two operands operation operative to transform a first data and a second data into a third data.

10. The method of claim 6, wherein executing the ECC-Space operation in the logic circuit comprises executing the ECC-Space operation in a second processor as the logic circuit.

11. The method of claim 6, wherein the instruction received includes a two operands operation operative to transform a first data and a second data into a third data, and wherein executing the ECC-Space operation in the logic circuit comprises:
executing the ECC-Space operation using an ECC encoded first data as a first operand and an ECC encoded second data as a second operand to generate an ECC encoded output data; and wherein the ECC encoded first data is identical to a result of encoding the first data and the ECC encoded second data is identical to a result of encoding the second data if the first data and the second data are encoded with an ECC algorithm.

12. The method of claim 11, wherein the ECC encoded output data is identical to a result of encoding the third data with the ECC algorithm if the third data is encoded with the ECC algorithm.

13. The method of claim 11, wherein a result of decoding the ECC encoded output data with the ECC algorithm is identical to the third data.

14. The method of claim 11, wherein the ECC encoded first data and the ECC encoded second data are fetched from a memory.

15. The method of claim 14, further comprising:
storing the ECC encoded output data to the memory.

16. The method of claim 11, wherein the ECC-Space operation is translated from the two operands operation based on the ECC algorithm.

17. A device comprising:
a memory operative to store an ECC encoded first data and an ECC encoded second data;
a logic circuit in the memory configured to execute an ECC-Space operation related to an ECC algorithm, wherein the ECC-Space operation is translated from a two operands operation that is operative to transform a first data and a second data into a third data, and wherein the ECC-Space operation is operative to generate an ECC encoded output data from the ECC encoded first data and the ECC encoded second data; and
wherein the ECC encoded first data is encoded from the first data with the ECC algorithm and the ECC encoded second data is encoded from the second data with the ECC algorithm, and wherein the ECC encoded output data is identical to a result of encoding the third data with the ECC algorithm.

18. The device of claim 17, further comprising:
a first processor, connecting with the memory through a data bus, and configured to receive a first opcode representing the two operands operation; and
a translator operative to translate the first opcode representing the two operands operation into a second opcode representing the ECC-Space operation.

19. The device of claim 17, wherein the logic circuit comprises:
a PIM enabling logic circuit configured to execute the ECC-Space operation.

20. The device of claim 17, wherein the logic circuit comprises:
a PIM enabling logic circuit configured to generate the third data by executing a truncated ECC-Space operation; and
an ECC encoder configured to encode the third data into the ECC coded output data with the ECC algorithm.

* * * * *